(12) United States Patent
Kikuchi et al.

(10) Patent No.: US 6,906,790 B2
(45) Date of Patent: Jun. 14, 2005

(54) RETICLE MANIPULATORS AND RELATED METHODS FOR CONVEYING THIN, CIRCULAR RETICLES AS USED IN CHARGED-PARTICLE-BEAM MICROLITHOGRAPHY

(75) Inventors: Hidekazu Kikuchi, Miyagi Prefecture (JP); Akihiro Yamamoto, Sendai (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/635,661

(22) Filed: Aug. 5, 2003

(65) Prior Publication Data

US 2004/0027552 A1 Feb. 12, 2004

(30) Foreign Application Priority Data

Aug. 5, 2002 (JP) ........................................ 2002-226927

(51) Int. Cl.[7] .............................................. G03B 27/42
(52) U.S. Cl. .............................. 355/75; 355/53; 355/72; 414/935; 414/936; 414/940; 414/941; 396/611
(58) Field of Search ............................. 355/53, 72, 77; 414/935–941; 396/611

(56) References Cited

U.S. PATENT DOCUMENTS

| | | | | |
|---|---|---|---|---|
| 5,937,223 A | * | 8/1999 | Akimoto et al. ............ | 396/604 |
| 6,126,381 A | * | 10/2000 | Bacchi et al. ............... | 414/754 |
| 6,414,744 B1 | * | 7/2002 | Kuiper et al. ................ | 355/75 |
| 6,585,470 B2 | * | 7/2003 | Van Der Meulen ......... | 414/217 |
| 6,632,065 B1 | * | 10/2003 | Cameron et al. ...... | 414/416.03 |
| 2001/0041120 A1 | * | 11/2001 | Hofmeister ................ | 414/217 |

FOREIGN PATENT DOCUMENTS

KR   2001-017920   * 3/2001

* cited by examiner

Primary Examiner—D. Rutledge
(74) Attorney, Agent, or Firm—Klarquist Sparkman, LLP

(57) ABSTRACT

Robotic reticle manipulators are disclosed for use in holding and conveying, with good stability, thin, circular reticles as used in charged-particle-beam microlithography. A manipulator embodiment includes at least one arm configured for executing movements in the X-, Y-, and Z-directions. Connected distally to the at least one arm is a U-shaped fork (as an exemplary reticle-support member) defining recessed surfaces and vacuum ports for holding the reticle at the reticle's narrow handling zone located along the periphery of the reticle. Each vacuum port includes an upwardly extending lip that defines, on its "upward"-facing surface, a respective reticle-contact surface. Three such vacuum ports are provided on the fork and are nearly equidistantly separated from one another. Thus, as the reticle is being held and conveyed by the manipulator, the reticle is securely held to prevent reticle damage.

38 Claims, 4 Drawing Sheets

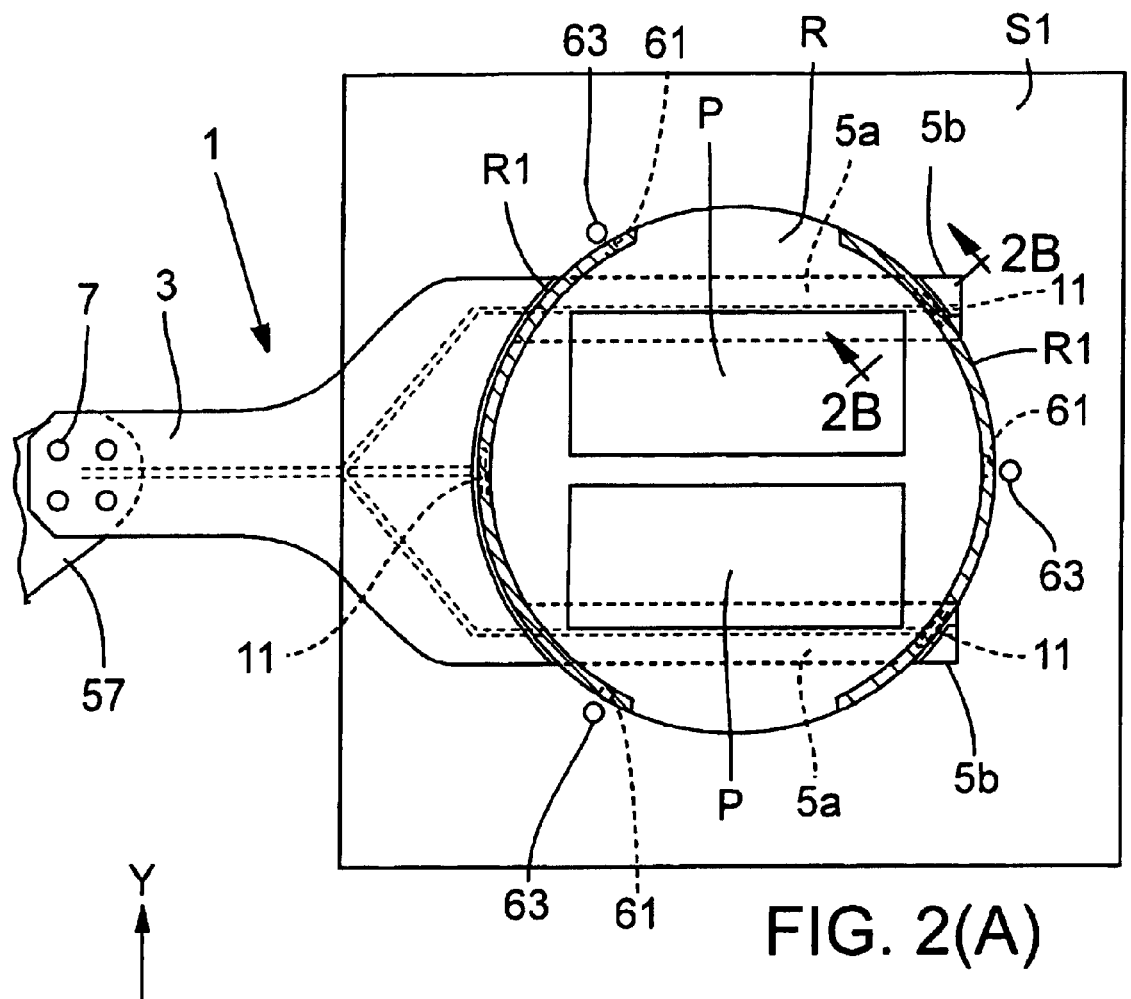
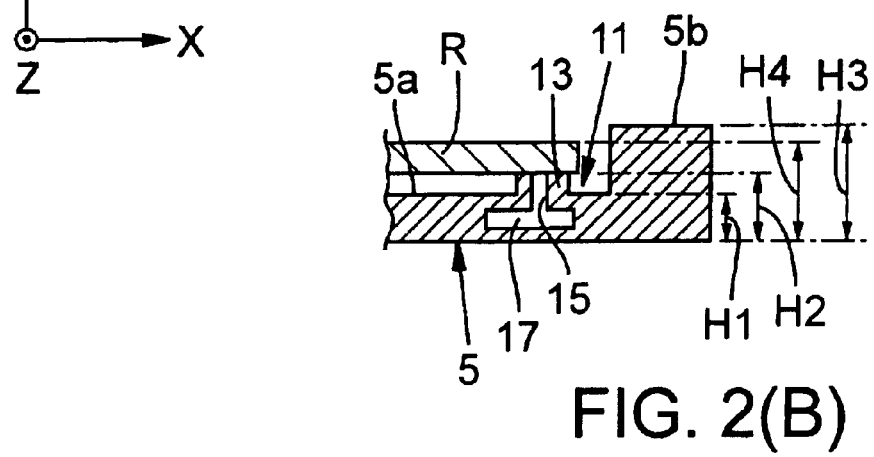
FIG. 2(A)
FIG. 2(B)

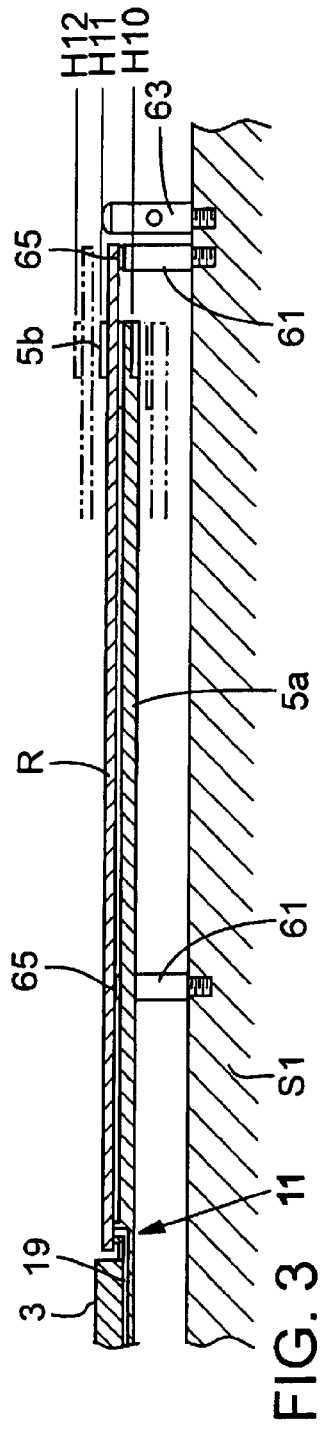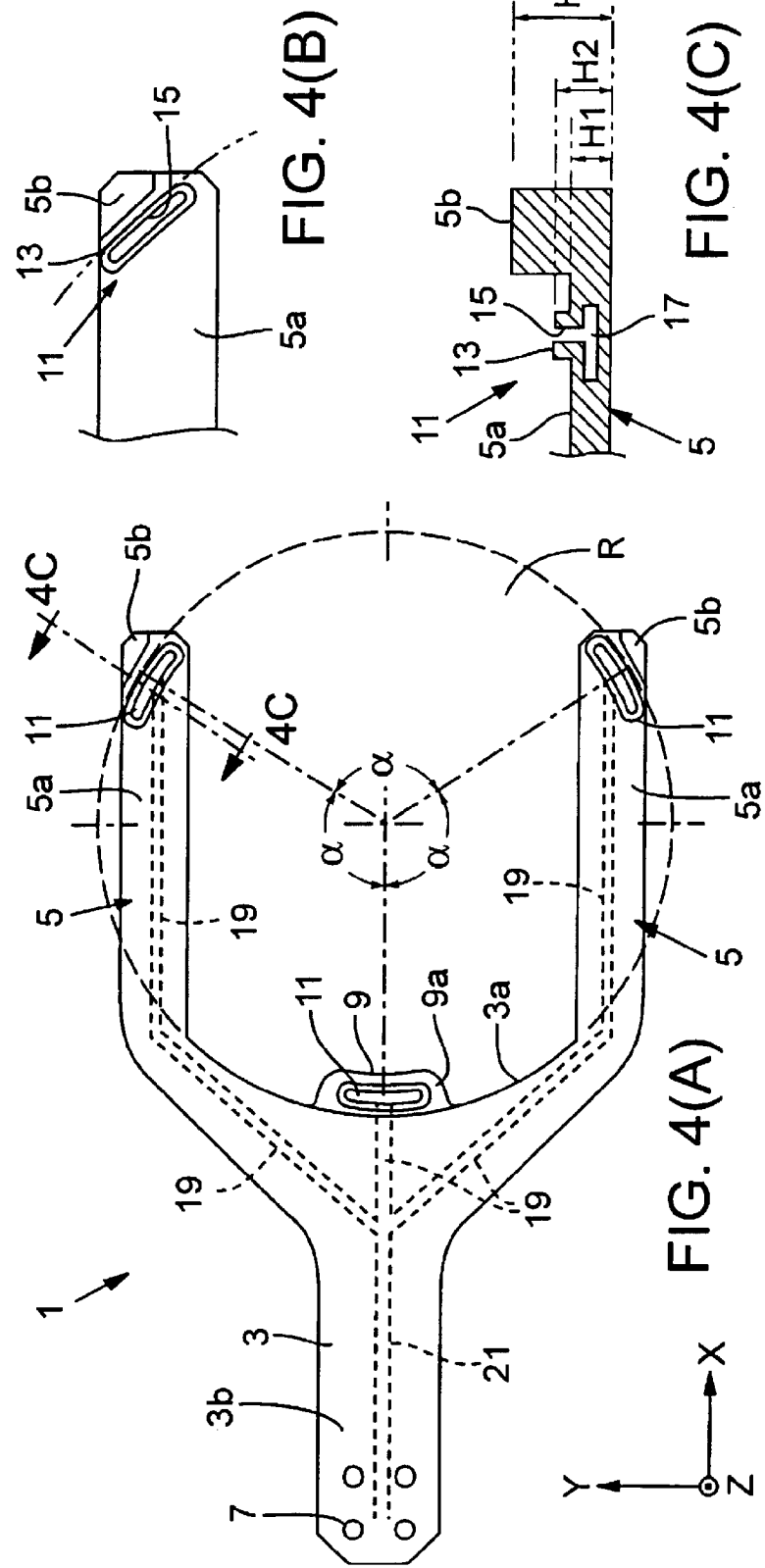

RETICLE MANIPULATORS AND RELATED METHODS FOR CONVEYING THIN, CIRCULAR RETICLES AS USED IN CHARGED-PARTICLE-BEAM MICROLITHOGRAPHY

FIELD

This disclosure pertains to microlithography, which is a key technique used in the manufacture of microelectronic devices such as integrated circuits, memories, displays, micromachines, and the like. The specific microlithography technology involves projection of a pattern, defined on a reticle or mask (termed "reticle" herein), from the reticle to a lithographic substrate coated with an exposure-sensitive resist. More specifically, the disclosure pertains to devices and methods for manipulating and holding a reticle for use in a microlithography system or other system configured to use or manipulate a reticle. The subject devices are configured especially for manipulating and holding thin, circular reticles, such as used in charged-particle-beam (CPB) micro lithography.

BACKGROUND

Conventional "optical" microlithography systems utilize respective deep-ultraviolet wavelengths of light as the lithographic energy beam, such as "i-line" radiation from a mercury lamp or light produced by an excimer laser such as a KrF or ArF excimer laser. The reticle (pattern-defining master plate) used in optical microlithography typically is made of glass, has a square or other rectilinear plan profile, and has a thickness of several mm. Since optical microlithography currently is the "workhorse" microlithography technology used widely throughout the world, reticle-manipulating devices in common use are configured for use with an optical-lithography reticle.

In recent years, substantial engineering effort has been directed to the development of a practical "next-generation" microlithography system that offers prospects of producing finer pattern-transfer resolution than currently obtainable using optical microlithography. One attractive next-generation lithography (NGL) approach involves the use of a charged particle beam, such as an electron beam or ion beam, as the lithographic-energy beam. A key challenge in the development of a practical electron-beam microlithography system is configuring the system to produce the desired fine-ness of pattern-transfer resolution without sacrificing "throughput" (number of units, such as semiconductor wafers, that can be exposed lithographically by the system per unit time).

In an electron-beam (EB) microlithography system (as an example of a CPB microlithography system), the thick, square, glass reticle conventionally used for optical microlithography is not used. Instead, the EB-lithography reticle typically is round (e.g., 200 to 300 mm in diameter) and much thinner (e.g., 0.5 to 1.0 mm). These reticles are made from silicon wafers ("reticle substrates") having a standardized configuration (e.g., a particular diameter, thickness, notched, or non-notched) according to standards established by Semiconductor Equipment and Materials International (SEMI). Almost the entire surface of the EB-lithography reticle is patterned. Since the entire pattern cannot be exposed in a single exposure "shot," the EB lithography reticle is divided into multiple "exposure units" (usually termed "subfields") each defining a respective portion of the pattern and being individually exposed. During exposure an electron beam is irradiated, from above, onto a selected subfield of the reticle.

Portions of the reticle that define pattern features and that actually are irradiated by the electron beam are membranous and hence very thin and delicate. Consequently, these portions of the reticle must not contact any other surfaces (such as a surface of a reticle manipulator). Rather, during reticle manipulation, the reticle must be handled and supported only by its non-patterned (and more robust) peripheral "handling zone." The handling zone of an EB-lithography reticle typically is narrow, with a maximum usable width of several mm.

Unfortunately, among conventional reticle "manipulators" (encompassing any of various devices, usually robotic, that perform handling and/or moving of the reticle), none are configured to accommodate a thin, circular, reticle or reticle substrate as used in EB microlithography or CPB microlithography in general.

SUMMARY

In view of the shortcomings of conventional reticle manipulators, as summarized above, this invention is directed to, inter alia, reticle manipulators and associated reticle-handling methods for holding and moving, with the requisite stability, thin, circular reticles of a type used in EB and other CPB microlithography systems.

According to a first aspect of the invention, reticle manipulators are provided for handling a circular reticle having a peripheral handling zone. An embodiment of such a reticle manipulator comprises a movable member and a reticle-support member. The reticle-support member has a trunk portion, coupled to the movable member, and a distal portion. An especially suitable configuration for the reticle-support member is a "fork," in which the distal portion comprises two tines that extend from the trunk portion, as summarized below. The trunk portion and distal portion defines respective vacuum ports situated and configured to engage, with vacuum suction, three respective locations in the handling zone so as to hold the reticle to the reticle-support member without contacting the patterned area.

The movable member can be a first arm having a distal end to which is coupled the trunk portion of the reticle-support member. This configuration further can comprise a base, wherein the first arm has a proximal end connected to the base in a manner allowing the first arm to be actuated robotically relative to the base so as to cause the distal end of the first arm to move relative to the base. This configuration further can comprise a second arm having a proximal end and a distal end, wherein the proximal end of the second arm is connected to the distal end of the first arm, the distal end of the second arm is connected to the trunk portion of the reticle-support member, and the second arm is configured at least to pivot relative to the first arm.

The reticle-support member desirably is configured to engage the locations, in the handling zone, on the undersurface of the reticle. Further desirably, the vacuum ports are situated equidistantly from each other.

Each vacuum port desirably defines a respective vacuum aperture, wherein each vacuum aperture is elongated in a manner following an outer-edge curvature of the reticle.

The reticle manipulator can be configured such that the vacuum ports on the distal portion of the reticle-support member are situated near the ends of the distal portion. For example, the vacuum port on each tine can be situated near a distal end of the respective tine. In this configuration the vacuum port on the trunk portion can be situated at an edge of the trunk portion facing the reticle and situated between the tines. Further desirably, the vacuum ports are situated equidistantly from each other.

Each vacuum port desirably is surrounded by a respective lip presenting a respective reticle-contact surface that contacts the respective location in the handling zone whenever the reticle is being held to the reticle-support member.

The reticle-support member configured as a fork desirably has a U-shaped profile as defined by the tines extending from the trunk portion. Alternatively, for example, the fork can have a Y-shaped profile. Other profiles also are possible.

The distal portion of the reticle-support member desirably defines a recessed surface collectively providing a cradle in which the reticle fits whenever the reticle is being held by the reticle-support member. For example, each tine of a fork-shaped reticle-support member desirably defines the recessed surface. In this configuration the respective vacuum port in each tine is defined in the respective recessed surface of the tine, and each vacuum port in the tine is surrounded by a respective lip presenting a respective reticle-contact surface that contacts the respective location in the handling zone whenever the reticle is being held to the fork. The reticle-contact surface is elevated relative to the respective recessed surface so as to avoid the reticle contacting the recessed surfaces. This configuration further can comprise a projection extending from the trunk portion. The projection defines, in addition to the respective vacuum ports defined in each tine, the third vacuum port. The projection can define a recessed surface that, together with the recessed surfaces of the tines, collectively defines the cradle in which the reticle fits whenever the reticle is being held by the fork. In this configuration the respective vacuum port defined by the projection is defined in the recessed surface of the projection, and the vacuum port in the projection is surrounded by a lip presenting a respective reticle-contact surface that contacts the respective location in the handling zone whenever the reticle is being held to the fork. As noted above, this reticle-contact surface is elevated relative to the recessed surface.

The reticle-support member desirably defines at least one side-wall escarpment situated so as to engage a respective portion of an edge of the reticle whenever the reticle is being held to the reticle-support member. For example, in a fork-shaped reticle-support member, each of the tines and trunk portion desirably defines a respective side-wall escarpment. In this configuration the side-wall escarpments are adjacent respective recessed surfaces of the tines and trunk portion. The respective vacuum ports defined by each of the tines and trunk portion are defined in the respective recessed surfaces, and each vacuum port is surrounded by a respective lip presenting a respective reticle-contact surface that contacts the respective location in the handling zone whenever the reticle is being held to the fork. As noted above, each reticle-contact surface is elevated relative to the respective recessed surface so as to prevent the reticle from contacting the recessed surfaces. Further desirably, each of the side-wall escarpments has a radius substantially equal to a radius of the circular reticle.

The movable member desirably is robotically actuatable in each of X-, Y-, and Z-directions relative to the base so as to move the reticle in any desired direction in space.

If the handling zone of the reticle has a first portion and a second portion, the vacuum ports near the ends of the reticle-support member (e.g., in the tines) can be situated so as to engage respective locations in the first portion of the handling zone. In this configuration the vacuum port in the trunk portion can be situated so as to engage a respective location in the second portion of the handling zone.

According to another aspect of the invention, reticle-manipulation systems are provided. An embodiment of such a system comprises a first reticle station and a reticle manipulator for handling a circular reticle (having a peripheral handling zone) relative to the first reticle station. The reticle manipulator comprises (a) a first arm having a distal end, and (b) a reticle-support member having a trunk portion coupled to the distal end of the first arm and a distal portion extending from the trunk portion. As noted above, the trunk portion and the distal portion (e.g., each of the tines) defines a respective vacuum port situated and configured to engage, with vacuum suction, three respective locations in the handling zone so as to hold the reticle to the reticle-support member without contacting the patterned area as the reticle manipulator picks up a reticle from the first station or places a reticle on the first station. The reticle manipulator further can comprise a base and a second arm. In this configuration the first arm has a proximal end connected to the base in a manner allowing the first arm to be actuated robotically relative to the base so as to cause the distal end of the first arm to move relative to the base. The second arm has a proximal end and a distal end, wherein the proximal end of the second arm is connected to the distal end of the first arm, the distal end of the second arm is connected to the trunk portion of the reticle-support member, and the second arm is configured at least to pivot relative to the first arm.

The reticle-manipulation system further can comprises a second reticle station reachable by the reticle-support member of the reticle manipulator such that the reticle-support member, as moved by the first arm, can pick up a reticle from the second station or place a reticle on the second station. The first and second stations can be situated at 90° relative to each other.

At least the first station can comprise a base and three reticle-contact pins projecting from the base such that, as the reticle manipulator places a reticle on the first station, the reticle is placed on the three reticle-contact pins that contact the handling zone of the reticle and support the reticle in a tripod manner. The reticle-contact pins desirably are situated on the base equi-angularly and equi-distantly relative to each other. A respective stop pin can be situated outboard of the each reticle-contact pin so as to be situated adjacent a respective location on an edge of the reticle whenever the reticle is resting on the reticle-contact pins.

The reticle-support member desirably has a width dimension sufficient to allow the reticle-support member to be inserted between two of the three reticle-contact pins without contacting the reticle-contact pins.

According to yet another aspect of the invention, microlithography systems are provided that utilize a circular reticle having a peripheral handling zone. An embodiment of such a system comprises (a) an optical column containing a reticle stage, (b) a reticle-holding chamber connected to the optical column, and (c) a reticle manipulator situated relative to the reticle-holding chamber. The reticle manipulator has a configuration such as any of the configurations summarized above. The system further can comprise a reticle-alignment chamber connected to the reticle-holding chamber, wherein the reticle manipulator is configured to move a reticle from the reticle-alignment chamber to the reticle-holding chamber. In this configuration the reticle manipulator can be situated, for example, between the reticle-alignment chamber and the reticle-holding chamber.

At least the reticle-holding chamber can comprise a reticle station that comprises a base and three reticle-contact pins projecting from the base such that, as the reticle manipulator places a reticle on the station, the reticle is placed on the three reticle-contact pins that contact the handling zone of the reticle and support the reticle in a tripod manner.

According to yet another aspect of the invention, methods are provided for handling a circular reticle having a peripheral handling zone. An embodiment of such a method comprises placing a reticle-support member relative to the reticle such that three vacuum ports of the reticle-support member contact respective locations in the handling zone. A vacuum (relative to an ambient atmosphere in which the reticle is located) is applied to the vacuum ports so as to adhere the reticle to the reticle-support member. The reticle-support member is moved so as to displace the reticle, adhering to the reticle-support member, to a reticle station. The reticle is placed at the reticle station by releasing the vacuum.

The first station can comprise a base and three reticle-contact pins projecting from the base such that, as the reticle manipulator places a reticle on the first station, the reticle is placed on the three reticle-contact pins that contact the handling zone of the reticle and support the reticle in a tripod manner.

The reticle typically has a patterned area (or, if the "reticle" is a reticle blank, an area destined to become the patterned area). In this situation the reticle-support member desirably holds the reticle without contacting the patterned area.

The reticle-support member desirably is configured as a fork having a trunk portion and two tines, wherein the trunk portion and each of the tines defines a respective vacuum port that contacts the respective location in the handling zone during the placing step. Desirably, the vacuum ports contact the respective locations in the handling zone without the reticle-support member contacting any other part of the reticle except an edge of the reticle.

The reticle-support member can be coupled to an arm mechanism configured to move in each of X-, Y-, and Z-directions. With such a configuration the placing steps and moving step in the method desirably each comprise moving the reticle-support member as required using respective movements of the arm mechanism.

The foregoing and additional features and advantages of the invention will be more readily apparent from the following detailed description, which proceeds with reference to the accompanying drawings.

BRIEF DESCRIPTION OF THE DRAWINGS

FIG. 2(A) is a plan view of a U-shaped fork (as an exemplary reticle-support member), of the manipulator of FIG. 1, holding a circular reticle and situated over a first station.

FIG. 2(B) is an elevational section along the line B—B in FIG. 1.

FIG. 3 is an elevational section depicting certain details of motion of the reticle-support member and reticle of FIG. 1 as the manipulator places the reticle on holding pins at a first station.

FIG. 4(A) is a plan view showing certain structural details of the U-shaped fork (as an exemplary reticle-support member) of the reticle manipulator of FIG. 1, including details of the vacuum ports used for holding the reticle on the fork.

FIG. 4(B) is an enlargement showing details of the distal end of one tine of the fork.

FIG. 4(C) is an elevational section along the line A—A in FIG. 4(A).

DETAILED DESCRIPTION

The invention is described below in the context of a representative embodiment that is not intended to be limiting in any way. As used herein a "reticle manipulator" is any of various devices that handle (including hold and/or move) a reticle.

Figure 1:
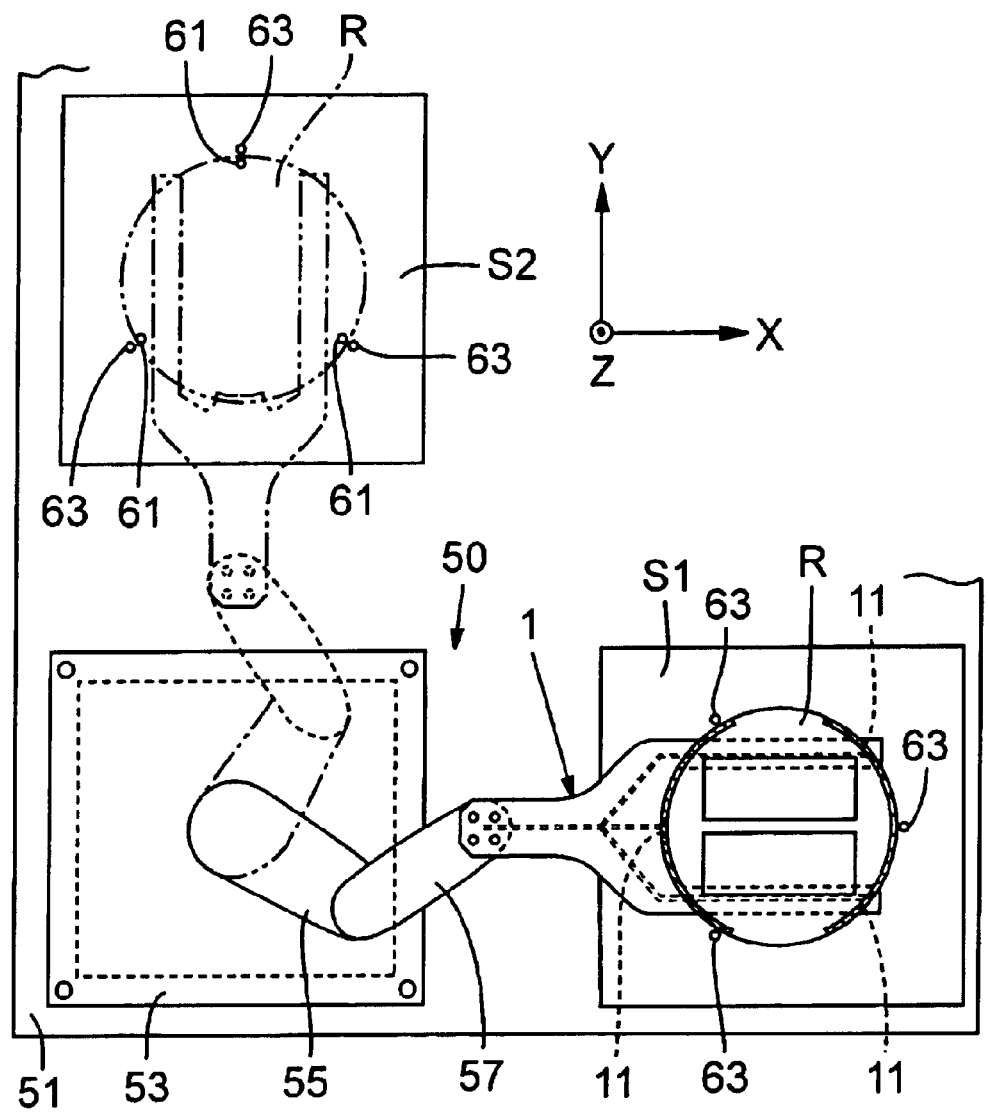
FIG. 1 is a plan view depicting the overall structure and configuration of a reticle manipulator according to a representative embodiment.

Reference is made first to FIGS. 1 and 2(A)–2(B), which depict certain details of a reticle manipulator 50 according to a representative embodiment. Turning first to FIG. 1, the subject reticle manipulator 50 conveys (moves) the reticle R, in air or other prevailing atmosphere, between two stations S1, S2. A station S1, S2 can be, for example, a reticle "pod" (holding container), a pre-alignment chamber, a load-lock chamber, or the like. In this embodiment the reticle manipulator 50 is essentially a robot and comprises a base 53 mounted to a support 51 or the like, a first arm 55 having a proximal end rotatably (pivotably) attached to the base 53, a second arm 57 having a proximal end rotatably (pivotably) coupled to the distal end of the first arm 55, and a U-shaped fork 1 (as an exemplary reticle-support member) that is rotatably (pivotably) coupled to the distal end of the second arm 57. The first arm 55 also is configured to move, relative to the base 53, in the Z-direction. The stations S1, S2 in this example are situated at respective positions that are 90° apart, relative to the base 53, but this arrangement is not to be regarded as limiting.

Turning now to FIG. 2(A), each station S1, S2 in this embodiment comprises three respective reticle-holding pins 61 used for supporting the reticle R whenever the reticle is being held by the manipulator 50. The reticle-holding pins 61 project "upward" (in the Z-direction) from the "upper" surface of the station S1. The depicted reticle R comprises two patterned regions P (each consisting of a large number of subfields arranged in rows and columns) situated centrally in the reticle R. The reticle R also includes a "handling zone" R1 situated along the periphery of the reticle. The handling zone R1, typically having a radial width of only several mm, is the only portion of the reticle R that can be touched by the reticle manipulator without posing a high risk of reticle damage. Note that the handling zone R1 in the depicted reticle actually consists of two portions, as shown in FIG. 2(A), extending circumferentially along respective parts of the outer edge of the reticle R. Thus, the reticle-holding pins 61 are located at respective positions such that, whenever the reticle R is resting on the reticle-holding pins 61 in the correct manner (as described later below), each reticle-holding pin is situated in the handling zone R1. To hold the reticle R in a stable, tripod manner, the three reticle-holding pins 61 desirably are arranged equi-angularly, about the center of the reticle R, relative to each other. (Thus, the holding pins 61 are situated at respective apices of an equilateral triangle on the upper surface of the station S1.)

As shown in FIG. 3, each reticle-holding pin 61 has an "upper" (distal) surface on which is provided a respective reticle-contact pad 65. As mounted on the reticle-holding pins 61, each reticle-contact pad 65 has an "upper" (reticle-contact) surface that is coplanar with the respective reticle-contact surfaces of the other two reticle-contact pads 65.

Thus, whenever the reticle R is being held on the reticle-holding pins 61, the handling zone R1 of the reticle actually is resting on the "upper" surfaces of the reticle-contact pads 65. Since the reticle R thus is being held in a tripod manner by the three reticle-holding pins 61 arranged at equal intervals from one another, the reticle is held in a stable manner at all times while at the station.

The upper surface of the station S1 also includes respective stop pins 63 that project "upward" (in the Z-direction) from the "upper" surface of the station S1. Each stop pin 63 is situated radially outboard of a respective reticle-holding pin 61. Thus, each stop pin 63 is situated on a respective radius line extending from the center of a circle, corresponding to the outline of the reticle R situated as shown in FIG. 2(A), through the center of the respective reticle-holding pin 61. Each stop pin 63 is longer ("higher") than the respective reticle-holding pin 61 (specifically, the height of the "upper" surface of the respective reticle-contact pad 65). The stop pins 63 prevent misalignments and mispositionings of the reticle in the horizontal (X-Y) direction whenever the reticle R is being held on the reticle-holding pins 61.

As noted earlier above, the reticle-support member of the reticle manipulator 50 can have any of various configurations, but a fork-shaped configuration is especially desired for ease of use, reduced mass, and other factors. FIGS. 4(A)–4(C) depicts details of an exemplary reticle-support member configured as a U-shaped fork 1. The fork 1 comprises a trunk portion 3 from which two tines 5 extend parallel to each other and coplanarly with the trunk portion 3. Thus, the tines 5 are symmetrically arranged along a center line of the length dimension of the trunk portion 3. In FIG. 4(A) the distance (in the Y-direction of the figure) across the respective outsides of the tines 5 is narrower than the distance (in the Y-direction in the figure) between the two right-hand reticle-holding pins 61. As a result, the tines 5 can be inserted between these right-hand reticle-holding pins 61, as shown in FIG. 2(A). In this embodiment, the tines 5 are configured to allow placement of the vacuum ports 11 equidistantly and equi-angularly from one another. (As shown, the vacuum ports 11 are spaced apart by the angle α, which places them equidistant from one another.) The proximal end of the trunk portion 3 of the fork 1 defines attachment holes 7 used for attaching, using machine screws or analogous fasteners, to a pivot bearing (not detailed but well understood in the art) in the distal end of the second arm 57 (FIG. 2(A)). Thus, whenever the pivot bearing rotates (pivots) relative to the second arm 57, the fork 1 is correspondingly pivoted relative to the distal end of the second arm 57.

Further regarding the fork 1 of this embodiment, the trunk portion 3 defines an arcuate side wall (escarpment) 3a extending "upward" (in the Z-direction in FIG. 4(A)) at the base of the tines 5. The radius of the side wall 3a desirably is the same as the radius of the reticle R being held by the fork 1. Extending (in the X-direction in FIG. 4(A)) from the side wall 3a, approximately mid-way between the tines 5, is a projection 9 extending in the X-direction in the figure from the trunk portion 3. The projection 9 is overlapped by a reticle R being held by the fork 1. The projection 9 defines a recessed surface 9a that is "lower" (in the –Z-direction in the figure) than the "top" surface 3b of the trunk portion 3. Similarly, each tine 5 has a respective recessed surface 5a that is "lower" (in the –Z-direction in the figure) than the "top" surface 3b of the base portion 3 and the "top" surface 5b of the distal end of each tine. The recessed surfaces 9a, 5a collectively define a cradle in which the reticle R rests (but without actually contacting the surfaces 9a, 5a), as discussed later below, whenever the reticle R is being held by the fork 1. The recessed surface 5a of each tine 5 extends (in the X-direction in the figure) edge-to-edge with respect to the reticle R. In addition, the tines 5 are situated and configured relative to each other such that the respective distances (in the X-direction in the figure) from the projection 9 to the distal ends of the respective tines 5, as well as the distance (in the Y-direction in the figure) between the distal ends of the respective tines 5, are at respective maxima.

Whenever a reticle R is mounted in the cradle, a proximal edge of the reticle is situated adjacent the side wall 3a. (See FIG. 4(A), depicting the outline of the reticle R relative to the side wall 3a.) Turning now to FIG. 4(C), note that the "height" H3 (in the Z-direction in the figure) of the "top" surfaces 5b, which have the same "height" as the "top" surface 3b of the trunk portion and are located outside the recessed surfaces 5a of the tines 5, is greater than the "height" H1 of the recessed surfaces 5a and 9a.

The recessed surface 9a of the projection 9 and the respective recessed surface 5a near the distal end of each of the tines 5 each define a respective vacuum port 11 (FIGS. 2(B) and 4(C). Whenever the reticle R is mounted in the cradle, a respective location in the handling zone R1 of the reticle rests on a respective vacuum port 11. Each vacuum port 11 attracts the reticle R by application of vacuum suction at the respective location in the handling zone R1. As shown in FIGS. 4(B) and 4(C), each vacuum port 11 includes an "upwardly" (Z-direction in the figure) projecting lip 13 surrounding an elongated vacuum aperture 15. In the tines 5, the lips 13 extend upward from the recessed surface 5a. The elongation of the vacuum aperture 15 follows the curvature of the outer edge of the reticle R. The "height" H2 (in the Z-direction in the figure) of the lips 13 is the same in the tines 5 and in the projection 9. Thus, whenever the reticle R is mounted in the cradle, the reticle rests on the "upper" surface of each of the lips 13 of the vacuum ports 11. I.e., the upper surfaces of the lips 13 serve as reticle-supporting surfaces of the fork 1. Note that the height H2 is less than the height H3 of the "top" surface 3b of the trunk portion 3 and of the "top" surface 5b of the tines. Also, in FIG. 2(B), note that the "height" H4 (in the Z-direction in the figure) of the "upper" surface of the reticle R resting on the lips 13 is less than the height H3.

In general, since the reticle actually rests on the upper surface of each lip 13, it will be appreciated that the configuration of the fork 1 (as an exemplary configuration of a reticle-support member) is not to be regarded as limiting. The reticle-support member can have any configuration capable of providing the three points of contact. Any of the various configurations will have a "trunk" portion and a "distal" portion (the latter represented by tines on a fork).

The vacuum apertures 15 are connected to cavities 17 defined inside the tines. The cavities 17, in turn, are connected to respective vacuum conduits 19 extending (mostly in the X-direction in the figure) inside the thickness dimension of the fork 1. The respective vacuum conduits 19 merge inside the trunk portion 3 into a main conduit 21 that is connected to a valve-controlled vacuum source (not shown but well understood in the art).

Further aspects of mounting the reticle R on the fork 1 are discussed with reference to FIGS. 2(A)–2(B). In FIG. 2(A), the reticle R includes two patterned regions P centrally located in the reticle R. Outside the patterned regions P, along the edge of the reticle R are two opposing handling zones R1 each having a width (in the radial direction) of several mm.

Whenever the reticle R is being supported by the fork 1, as described above, respective locations (three total) in the handling zone R1 contact respective lips 13 of the vacuum ports 11. The patterned regions P are not contacted. Since the height H4 of the reticle R being thus held is less than the height H3, as mentioned above, the side wall 3a and, on the tines, the escarpment between the surfaces Sa and 5b serve as positional stops for the reticle. These positional stops prevent the reticle R from being mispositioned in the "horizontal" (X-Y) direction on the fork 1.

After placing the reticle R in the cradle of the fork 1, as discussed above, the reticle R is held fast to the fork by vacuum applied to the cavities 17 and thus to the vacuum ports 11. Thus, the reticle R can be moved using the reticle manipulator without concern of reticle damage or of the reticle falling from the fork.

The vacuum ports 11 are situated such that the respective distances between the adjacent vacuum ports 11 are as long as possible for maximal stability of the reticle R being held in a tripod manner on the fork 1.

The manner in which the reticle R is conveyed using the reticle manipulator described above is described with reference to FIGS. 2(A) and 3. The description is set forth in the context of the fork 1 (holding the reticle R) having been moved to the station S1. As the reticle is being conveyed to the station S1, the vacuum pump connected to the vacuum ports 11 is on and the fork 1 (on which the reticle R has been placed as described above) moves within a plane that is "higher" (in the Z-direction) than the upper surfaces of the stop pins 63 of the station S1. After moving the reticle R to the station S1 the fork 1 is situated between the two reticle-holding pins 61 closest to the reticle manipulator, and the handling zones R1 of the reticle R are situated directly "above" the respective reticle-holding pins 61. The fork 1 is lowered (by lowering the first arm 55 in the −Z-direction) until the reticle R (at "height" H12) is just above the reticle-contact pads 65. The vacuum is turned off, thereby releasing the suction of the reticle R to the fork 1.

Then, the first arm 55 is lowered further, with the tines 5 moving vertically "downward" between the reticle-holding pins 61, until the handling zones R1 of the reticle R come to rest on respective reticle-contact pads 65 of the reticle-holding pins 61. At this moment the "top" surfaces 5b of the tines 5 are at the "height" H11. Since the vacuum suction of the reticle R to the fork 1 was relieved previously, the reticle R is left resting on the reticle-contact pads 65 as the first arm 55 is lowered slightly more to bring the "top" surfaces 5b to the lesser height H10. Subsequent coordinated pivoting motions of the first arm 55 and second arm 57 withdraw the fork 1 from the station S1 toward the manipulator. Since the "height" of the "top" surfaces 5b of the tines 5 is less than the "height" of the "lower" surface of the reticle R, the fork 1 does not contact the reticle R as the fork is being withdrawn.

Meanwhile, the reticle R resting on the reticle-contact pads 65 is kept properly positioned at the station S1 by means of the stop pins 63.

The operation of picking up the reticle R from the station S1 is the reverse of the operation, described above, of placing the reticle at the station S1.

In the example of FIG. 1, two stations S1, S2 are used. However, it will be understood that this number of stations is not limiting in any way. The reticle manipulator 50 can be used with any number of stations arranged within the movement range of the fork 1 held on the arms 55, 57. In addition, although the reticle R is described as being held, at a station, on reticle-contact pads 65, it will be understood that the reticle can be held by an alternative means such as an air-suction system.

Figure 5:
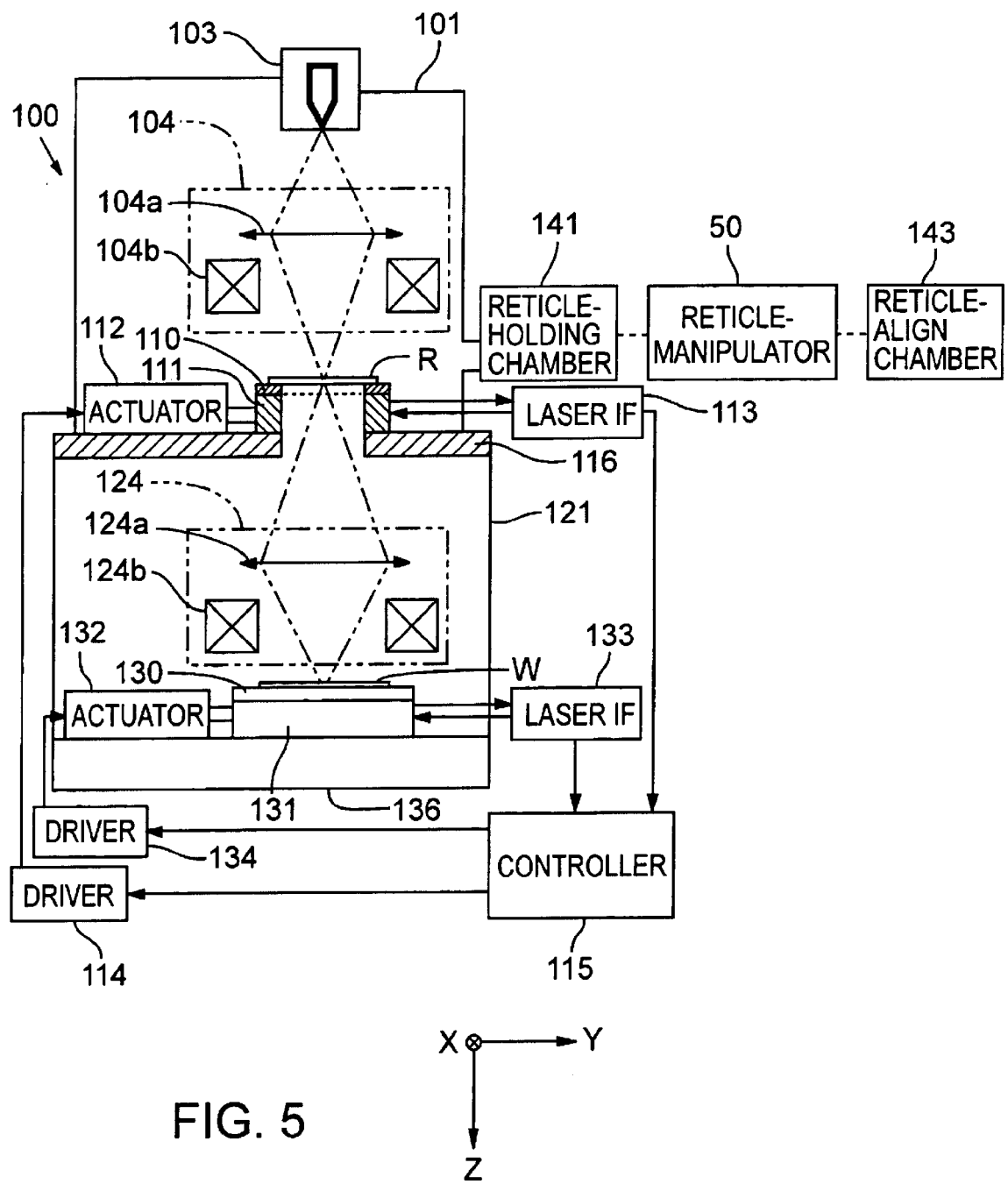
FIG. 5 is a schematic elevational diagram of an exemplary microlithographic-exposure system configured to utilize a reticle manipulator as disclosed herein.

An embodiment of an electron-beam microlithography system 100 with which a reticle manipulator as described above can be used is depicted in FIG. 5. The system 100 includes an optical column 101 situated at the upstream end of the system. The optical column 101 is configured as a vacuum chamber having an interior space that is evacuated using a vacuum pump (not shown but well understood in the art) connected via a vacuum conduit to the optical column 101.

At the extreme upstream end of the optical column 101 is an electron gun 103 that emits an electron beam propagating in a downstream direction (downward in the figure). The electron beam, termed an "illumination beam," passes through an illumination-optical system 104 contained within the optical column 101 downstream of the electron gun 103. The illumination-optical system 104 comprises a condenser lens 104a, an electron-beam deflector 104b, and other components as required to trim, configure, and position the beam for illumination of a desired region of the reticle R situated downstream of the illumination-optical system 104. Specifically, the electron beam emitted from the electron gun 103 is condensed by the condenser lens 104a. The deflector 104b scans (sweeps) the illumination beam in the X- and/or Y-direction to illuminate, in a sequential manner, individual subfields of the reticle R located within the optical field of the illumination-optical system 104. For simplicity, only one condenser lens 104a is shown. Typically, the illumination-optical system 104 comprises multiple condenser lenses (i.e., two or more lens "stages"), as well as a beam-shaping diaphragm, a blanking diaphragm, and other components as required to achieve a desired condition of reticle illumination.

When not actually being used for making an exposure, the reticle R is accommodated in a reticle-holding chamber 141 connected to the optical column 101. The reticle R is conveyed to the reticle-holding chamber 141 from a reticle-alignment chamber 143 by a reticle manipulator 50 as described above. For exposure, the reticle is conveyed (by another reticle manipulator such as the embodiment 50 described above) from the reticle-holding chamber 141 to a reticle stage 111, on which the reticle is held by electrostatic attraction or other suitable means on an upstream-facing surface of a reticle chuck 110 mounted to the reticle stage 111. The reticle stage 111 is mounted on a platform 116.

The reticle stage 111 is moved by a reticle-stage actuator 112. Although the reticle-stage actuator 112 is shown at left in the figure, it typically is a linear motor or other suitable actuator that is integrated into the reticle stage 111. The reticle-stage actuator 112 is connected to a controller 115 via a reticle-stage driver 114. A laser interferometer 113 is used for determining the position of the reticle stage 111. The laser interferometer 113 also is connected to the controller 115. Thus, accurate positional data concerning the reticle stage 111, as measured by the laser interferometer 113, are input to the controller 115, which (in response to the positional data) generates and routes commands to the reticle-stage driver 114 to energize the reticle-stage actuator 112 as required to position the reticle stage 111 at a target position. Thus, the position of the reticle stage 111 is controlled accurately in real time.

A wafer chamber 121 (a second vacuum chamber) is situated downstream of the platform 116. The interior of the wafer chamber is evacuated by a vacuum pump (not shown).

The wafer chamber 121 contains a projection-optical system 124 (configured as a respective optical column) that includes a projection lens 124a, a deflector 124b, and other components as required. Downstream of the projection-optical system 124 is an exposure-sensitive substrate W (typically a resist-coated semiconductor wafer).

The electron beam that has passed through the reticle R is condensed by the projection lens 124a and deflected by the deflector 124b as required to form an image of the illuminated portion of the reticle R on a prescribed location on the surface of the substrate W. Even though only one projection lens 124a is shown in the figure, the projection-optical system 124 typically includes at least two projection lenses as well as aberration-correction lenses and deflector coils as required.

The substrate W is held (by electrostatic attraction or other suitable force) by a wafer chuck 130 mounted to the upstream-facing surface of a wafer stage 131. The wafer stage 131 is mounted on a platform or base 136.

The wafer stage 131 is moved by a wafer-stage actuator 132. Although the wafer-stage actuator 132 is shown at left in the figure, it typically is a linear motor or other suitable actuator that is integrated into the wafer stage 131. The wafer-stage actuator 132 is connected to the controller 115 via a wafer-stage driver 134. A laser interferometer 133 is used for determining the position of the wafer stage 131. The laser interferometer 133 also is connected to the controller 115. Thus, accurate positional data concerning the wafer stage 131, as measured by the laser interferometer 133, are input to the controller 115, which (in response to the positional data) generates and routes commands to the wafer-stage driver 134 to energize the wafer-stage actuator 132 as required to position the wafer stage 131 at a target position. Thus, the position of the wafer stage 131 is controlled accurately in real time.

Whereas the invention has been described in connection with multiple representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A reticle manipulator for handling a circular reticle having a peripheral handling zone, the reticle manipulator comprising:
    a movable member; and
    a reticle-support member having a trunk portion coupled to the movable member and a distal portion extending from the trunk portion, the trunk portion and distal portion defining respective vacuum ports situated and configured to engage, with vacuum suction, three respective locations in the handling zone so as to hold the reticle to the reticle-support member without contacting the patterned area.

2. The reticle manipulator of claim 1, wherein:
    the reticle-support member is configured as a fork, of which the distal portion is defined by two tines that extend from the trunk portion; and
    the tines define respective vacuum ports.

3. The reticle manipulator of claim 1, wherein the movable member is a first arm having a distal end to which is coupled the trunk portion of the reticle-support member.

4. The reticle manipulator of claim 3, further comprising a base, wherein the first arm has a proximal end connected to the base in a manner allowing the first arm to be robotically actuated relative to the base so as to cause the distal end of the first arm to move relative to the base.

5. The reticle manipulator of claim 3, further comprising a second arm having a proximal end and a distal end, wherein the proximal end of the second arm is connected to the distal end of the first arm, the distal end of the second arm is connected to the trunk portion of the reticle-support member, and the second arm is configured at least to pivot relative to the first arm.

6. The reticle manipulator of claim 1, wherein the reticle-support member is configured to engage the locations, in the handling zone, on the under-surface of the reticle.

7. The reticle manipulator of claim 1, wherein the vacuum ports are situated equidistantly from each other.

8. The reticle manipulator of claim 1, wherein:
    each vacuum port defines a respective vacuum aperture; and
    each vacuum aperture is elongated in a manner following an outer-edge curvature of the reticle.

9. The reticle manipulator of claim 1, wherein:
    the reticle-support member is configured as a fork, of which the distal portion is defined by two tines that extend from the trunk portion;
    the vacuum port on each tine is situated near a distal end of the respective tine; and
    the vacuum port on the trunk portion is situated at an edge of the trunk portion facing the reticle and situated between the tines.

10. The reticle manipulator of claim 9, wherein the vacuum ports are situated equidistantly from each other.

11. The reticle manipulator of claim 1, wherein each vacuum port is surrounded by a respective lip presenting a respective reticle-contact surface that contacts the respective location in the handling zone whenever the reticle is being held to the reticle-support member.

12. The reticle manipulator of claim 1, wherein:
    the reticle-support member is configured as a fork, of which the distal portion is defined by two tines that extend from the trunk portion; and
    the tines as extending from the trunk portion define a U-shaped profile to the fork.

13. The reticle manipulator of claim 1, wherein:
    the trunk portion and distal portion of the reticle-support member define a recessed surface that provides a cradle in which the reticle fits whenever the reticle is being held by the reticle-support member;
    the vacuum ports are defined in the recessed surface; and
    each vacuum port is surrounded by a respective lip presenting a respective reticle-contact surface that contacts the respective location in the handling zone whenever the reticle is being held to the reticle-support member, the reticle-contact surface being elevated relative to the recessed surface.

14. The reticle manipulator of claim 13, wherein:
    the reticle-support member is configured as a fork, of which the distal portion is defined by two tines that extend from the trunk portion; and
    the trunk portion includes a projection extending therefrom that defines, in addition to the respective vacuum ports defined in each tine, the third vacuum port.

15. The reticle manipulator of claim 14, wherein:
    the projection defines a recessed surface that, together with the recessed surfaces of the tines, collectively define the cradle in which the reticle fits whenever the reticle is being held by the fork;

the respective vacuum port defined by the projection is defined in the recessed surface of the projection; and the vacuum port in the projection is surrounded by a lip presenting a respective reticle-contact surface that contacts the respective location in the handling zone whenever the reticle is being held to the fork, the reticle-contact surface being elevated relative to the recessed surface.

16. The reticle manipulator of claim 1, wherein the trunk portion and distal portion of the reticle-support member define respective side-wall escarpments situated so as to engage a respective portion of an edge of the reticle whenever the reticle is being held to the reticle-support member.

17. The reticle manipulator of claim 16, wherein:

the reticle-support member is configured as a fork, of which the distal portion is defined by two tines that extend from the trunk portion;

the side-wall escarpments are adjacent respective recessed surfaces of the tines and trunk portion;

the respective vacuum ports defined by each of the tines and trunk portion are defined in the respective recessed surfaces; and each vacuum port is surrounded by a respective lip presenting a respective reticle-contact surface that contacts the respective location in the handling zone whenever the reticle is being held to the fork, each reticle-contact surface being elevated relative to the respective recessed surface so as to prevent the reticle from contacting the recessed surfaces.

18. The reticle manipulator of claim 16, wherein each of the side-wall escarpments has a radius substantially equal to a radius of the circular reticle.

19. The reticle manipulator of claim 1, wherein the movable member is robotically actuatable in each of X-, Y-, and Z-directions relative to the base.

20. The reticle manipulator of claim 1, wherein:

the handling zone has a first portion and a second portion;

the vacuum ports in the distal portion are situated so as to engage respective locations in the first portion of the handling zone; and the vacuum port in the trunk portion is situated so as to engage a respective location in the second portion of the handling zone.

21. A reticle-manipulation system, comprising:

a first reticle station; and a reticle manipulator for handling a circular reticle, having a peripheral handling zone, relative to the first reticle station, the reticle manipulator comprising (a) a first arm having a distal end, and (b) a reticle-support member having a trunk portion coupled to the distal end of the first arm and a distal portion extending from the trunk portion, the trunk portion and distal portion defining vacuum ports situated and configured to engage, with vacuum suction, three respective locations in the handling zone so as to hold the reticle to the reticle-support member without contacting the patterned area as the reticle manipulator picks up a reticle from the first station or places a reticle on the first station.

22. The system of claim 21, wherein the reticle manipulator further comprises:

a base, wherein the first arm has a proximal end connected to the base in a manner allowing the first arm to be robotically actuated relative to the base so as to cause the distal end of the first arm to move relative to the base; and a second arm having a proximal end and a distal end, wherein the proximal end of the second arm is connected to the distal end of the first arm, the distal end of the second arm is connected to the trunk portion of the reticle-support member, and the second arm is configured at least to pivot relative to the first arm.

23. The system of claim 21, further comprising a second reticle station reachable by the reticle-support member of the reticle manipulator such that the reticle-support member, as moved by the first arm, can pick up a reticle from the second station or place a reticle on the second station.

24. The system of claim 21, wherein the first and second stations are situated at 90° relative to each other.

25. The system of claim 21, wherein the first station comprises a base and three reticle-contact pins projecting from the base such that, as the reticle manipulator places a reticle on the first station, the reticle is placed on the three reticle-contact pins that contact the handling zone of the reticle and support the reticle in a tripod manner.

26. The system of claim 25, wherein the reticle-contact pins are situated on the base equi-angularly and equi-distantly relative to each other.

27. The system of claim 25, further comprising a respective stop pin situated outboard of the each reticle-contact pin so as to be situated adjacent a respective location on an edge of the reticle whenever the reticle is resting on the reticle-contact pins.

28. The system of claim 25, wherein the reticle-support member has a width dimension sufficient to allow the fork to be inserted between two of the three reticle-contact pins without contacting the reticle-contact pins.

29. A microlithography system that utilizes a circular reticle having a peripheral handling zone, the system comprising:

an optical column containing a reticle stage;

a reticle-holding chamber connected to the optical column; and a reticle manipulator situated relative to the reticle-holding chamber, the reticle manipulator comprising (a) a first arm having a distal end, and (b) a reticle-support member having a trunk portion, coupled to the distal end of the first arm, and a distal portion extending from the trunk portion, the trunk portion and distal portion defining vacuum ports situated and configured to engage, with vacuum suction, three respective locations in the handling zone so as to hold the reticle to the reticle-support member without contacting the patterned area as the reticle manipulator picks up a reticle from the reticle-holding chamber or places a reticle in the reticle-holding chamber.

30. The microlithography system of claim 29, further comprising a reticle-alignment chamber connected to the reticle-holding chamber, wherein the reticle manipulator is configured to move a reticle from the reticle-alignment chamber to the reticle-holding chamber.

31. The microlithography system of claim 30, wherein the reticle manipulator is situated between the reticle-alignment chamber and the reticle-holding chamber.

32. The microlithography system of claim 29, wherein at least the reticle-holding chamber comprises a reticle station that comprises a base and three reticle-contact pins projecting from the base such that, as the reticle manipulator places a reticle on the station, the reticle is placed on the three reticle-contact pins that contact the handling zone of the reticle and support the reticle in a tripod manner.

33. A method for handling a circular reticle having a peripheral handling zone, the method comprising:

placing a reticle-support member relative to the reticle such that three vacuum ports of the reticle-support member contact respective locations in the handling zone;

applying a vacuum, relative to an ambient atmosphere in which the reticle is located, to the vacuum ports so as to adhere the reticle to the reticle-support member;

moving the reticle-support member so as to displace the reticle, adhering to the reticle-support member, to a reticle station; and placing the reticle at the reticle station by releasing the vacuum.

34. The method of claim 33, wherein the first station comprises a base and three reticle-contact pins projecting from the base such that, as the reticle manipulator places a reticle on the first station, the reticle is placed on the three reticle-contact pins that contact the handling zone of the reticle and support the reticle in a tripod manner.

35. The method of claim 33, wherein:

the reticle has a patterned area; and reticle-support member holds the reticle without contacting the patterned area.

36. The method of claim 33, wherein:

the reticle-support member is configured as a fork having a trunk portion and two tines; and the trunk portion and each of the tines defines a respective vacuum port that contacts the respective location in the handling zone during the placing step.

37. The method of claim 33, wherein the vacuum ports contact the respective locations in the handling zone without the reticle-support member contacting any other part of the reticle except an edge of the reticle.

38. The method of claim 33, wherein:

the reticle-support member is coupled to an arm mechanism configured to move in each of X-, Y-, and Z-directions; and the placing steps and moving step each comprise moving the reticle-support member as required using respective movements of the arm mechanism.

* * * * *